United States Patent
Shirsat et al.

(10) Patent No.: US 12,429,517 B2
(45) Date of Patent: Sep. 30, 2025

(54) THERMAL MEASUREMENT OF MATERIALS

(71) Applicant: Sandisk Technologies, Inc., Milpitas, CA (US)

(72) Inventors: Rohan Shirsat, Bangalore (IN); Ankur Agrawal, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 629 days.

(21) Appl. No.: 17/903,632

(22) Filed: Sep. 6, 2022

(65) Prior Publication Data
US 2023/0091586 A1    Mar. 23, 2023

Related U.S. Application Data

(60) Provisional application No. 63/245,690, filed on Sep. 17, 2021.

(51) Int. Cl.
*G01R 31/28* (2006.01)
*G01R 31/26* (2020.01)

(52) U.S. Cl.
CPC ..... *G01R 31/2875* (2013.01); *G01R 31/2601* (2013.01); *G01R 31/2862* (2013.01)

(58) Field of Classification Search
CPC ............ G01R 31/2875; G01R 31/2601; G01R 31/2862; G01K 3/005; G01K 7/02; G01M 99/002; G01N 25/18
See application file for complete search history.

(56) References Cited

U.S. PATENT DOCUMENTS

2021/0396694 A1* 12/2021 Smith ...................... G01B 7/06
2024/0125843 A1*  4/2024 Nakayama ......... G01R 31/2874

FOREIGN PATENT DOCUMENTS

| EP | 1347280 A1 | * | 9/2003 | ............ G01M 11/30 |
| KR | 20220150823 A | * | 11/2022 | ......... G01R 31/2868 |
| KR | 20230111442 A | * | 7/2023 | ............... G01K 7/02 |

* cited by examiner

*Primary Examiner* — John E Breene
*Assistant Examiner* — Manuel Castellon
(74) *Attorney, Agent, or Firm* — Patterson + Sheridan, LLP

(57) ABSTRACT

A thermal measurement system includes a temperature-controlled chamber configured to house a Device Under Test (DUT) and a first temperature sensor to measure an external temperature of the DUT inside the temperature-controlled chamber. The thermal measurement system further includes a heating device for heating a test material outside the temperature-controlled chamber and a controller configured to control the heating device to heat the test material to the external temperature measured by the first temperature sensor of the DUT inside the temperature-controlled chamber. In one aspect, a thermethesiometer indicates a skin effect of a surface temperature of the test material outside the temperature-controlled chamber.

20 Claims, 3 Drawing Sheets

THERMAL MEASUREMENT OF MATERIALS

CROSS-REFERENCE TO RELATED APPLICATION

This application claims the benefit of U.S. Provisional Application No. 63/245,690 titled "THERMAL MEASUREMENT OF MATERIALS", filed on Sep. 17, 2021, which is hereby incorporated by reference in its entirety.

BACKGROUND

Manufacturers of products often measure the surface temperature of their products for safety under different conditions. The surface temperature of a product, or Device Under Test (DUT), can be measured using a temperature sensor, such as a thermocouple, but such temperature sensors do not indicate the effect of the surface temperature on human skin. A thermesthesiometer is a device approved by standards organizations, such as the International Electrotechnical Commission (IEC), for measuring the effect of a surface temperature on human skin. Themesthesiometers simulate a temperature response of human skin by using an encapsulated material in a probe that has similar thermal properties to skin.

However, thermesthesiometers can have some drawbacks when testing certain products, such as some electronic devices. One drawback is that thermesthesiometers are generally designed to be the most accurate at a particular ambient temperature, such as 32 degrees Celsius, but many products have a hardware-safe, ambient operating temperature range that exceeds the preferred design temperature for the thermethesiometer. This design or preferred temperature limit for thermesthesiometers can cause uncertainty as to the safety of products when operating in environments hotter than the design temperature, which may cause manufacturers to incorporate more expensive materials and/or cooling systems into their products that may not actually be needed to prevent harm when operating in warmer ambient temperatures.

In addition, the probes of thermesthesiometers are often larger than the surfaces of smaller products, such as a Universal Serial Bus (USB) flash drive or thumb drive, for example. In such cases, it can be difficult to use a thermesthesiometer and its indication of the effect of a surface temperature on human skin may not be accurate.

BRIEF DESCRIPTION OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed.

DETAILED DESCRIPTION

In the following detailed description, numerous specific details are set forth to provide a full understanding of the present disclosure. It will be apparent, however, to one of ordinary skill in the art that the various embodiments disclosed may be practiced without some of these specific details. In other instances, well-known structures and techniques have not been shown in detail to avoid unnecessarily obscuring the various embodiments.

Figure 1:
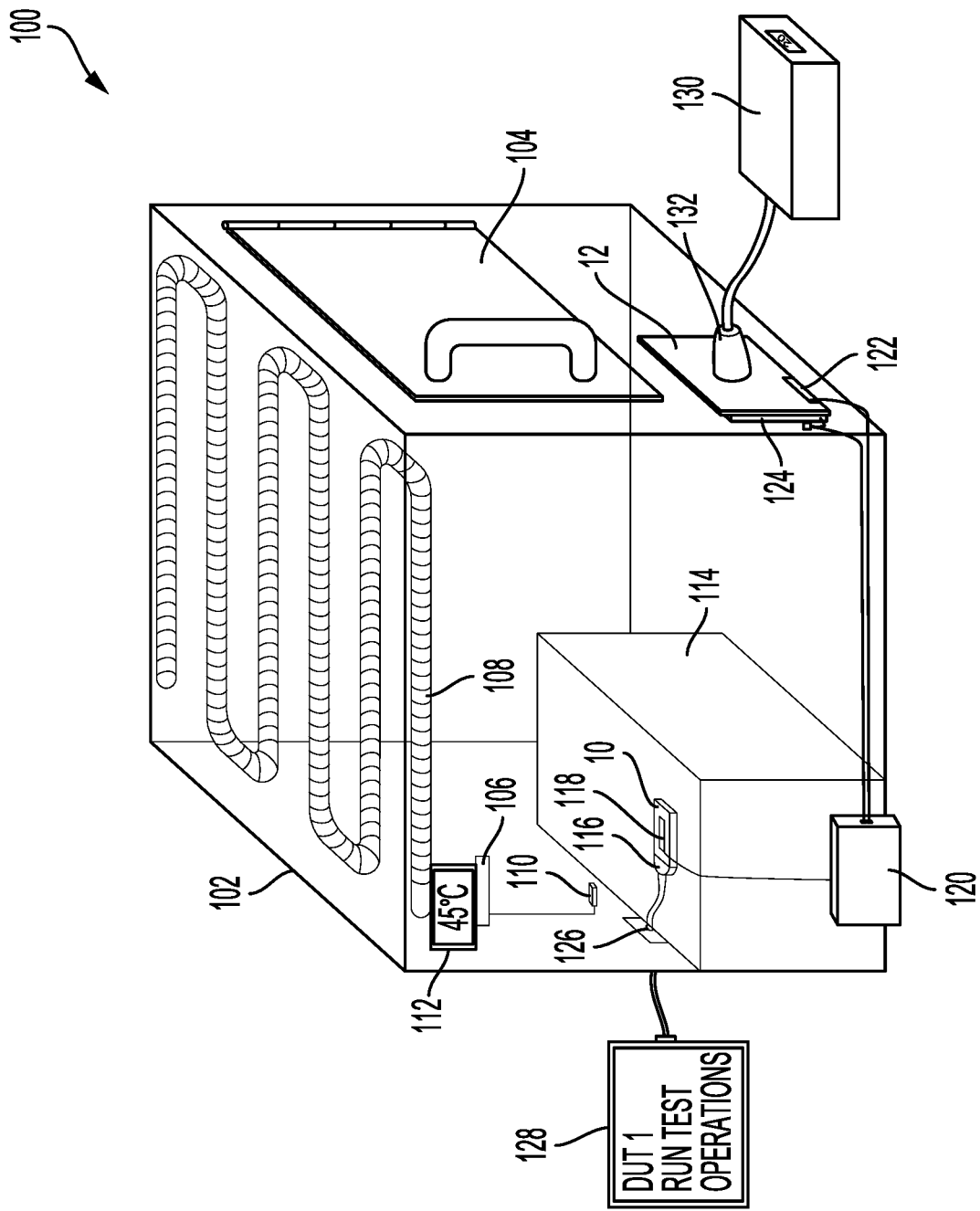
FIG. 1 is a perspective view of a thermal measurement system according to one or more embodiments.

FIG. 1 is a perspective view of thermal measurement system 100 according to one or more embodiments. As shown in FIG. 1, thermal measurement system 100 includes temperature-controlled chamber 102 for testing a surface temperature of a Device Under Test (DUT), such as DUT 10 shown inside chamber 102. DUT 10 is placed inside chamber 102 on testing table or bench 114 via door 104.

DUT 10 may include an electronic device, such as a Universal Serial Bus (USB) flash drive or other type of product that may have a form factor or surfaces that are too small to be accurately measured for surface temperature effects by a probe of a thermethesiometer, or that may have an ambient operating temperature range that exceeds an ambient temperature at which the thermethesiometer can best measure the effect of a surface temperature on human skin. Such an optimal or design ambient temperature for the measurement accuracy of a thermethesiometer is typically 32 degrees Celsius.

In this regard, system 100 includes thermethesiometer 130 outside of chamber 102 to allow for a more accurate measurement or indication of the effect of a surface temperature of DUT 10 on human skin (i.e., a "skin effect") while DUT 10 is exposed to a higher ambient temperature inside chamber 102. In the example of FIG. 1, DUT 10 is exposed to an ambient temperature of 45 degrees Celsius inside chamber 102, which would otherwise cause an inaccurate measurement by thermethesiometer 130. Other implementations may include testing DUTs at different ambient target temperatures in chamber 102 representing different upper temperature ranges for the DUTs, such as ambient target temperatures that are greater than the design or preferred ambient temperature for a thermethesiometer of 32 degrees Celsius, or even higher ambient temperatures greater than 40 degrees Celsius.

In addition, probe 132 of thermethesiometer 130 is larger than the exterior surfaces of DUT 10, which ordinarily makes measuring the thermal effect of the exterior surface of DUT 10 on human skin difficult and can result in inaccuracies in the measurement. As shown in FIG. 1, probe 132 of thermethesiometer 130 contacts test material 12 outside chamber 102. Test material 12 is comprised of the same material as an exterior component of DUT 10, such as an outer wall of DUT 10. In addition, test material 12 can have the same thickness as the exterior component of DUT 10.

Test material 12 is heated by heating device 124, which can include, for example, an electric resistance heater coated with a thermal insulating material. Temperature sensor 122 measures a temperature of test material 12 and provides an indication of the measured temperature to controller 120, which controls heating device 124 to heat test material 12 an external surface temperature of DUT 10 measured by temperature sensor 118 inside chamber 102. Temperature sensors 118 and 122 may include, for example, thermocouples or another type of temperature sensor. Controller 120 uses feedback from temperature sensor 122 on test material 12 to increase, maintain, or decrease heating of test material 12 so that the temperature measured by temperature sensor 122 on test material 12 reaches or is maintained at the temperature measured by temperature sensor 118 on DUT 10 inside chamber 102.

In this way, it is ordinarily possible to accurately measure the effect of the surface temperature of DUT 10 using thermethesiometer 130 at ambient temperatures greater than a design ambient temperature for thermethesiometer 130 (e.g., 32 degrees Celsius). In addition, the smaller form factor of DUT 10 with respect to the size of probe 132 does not affect the accuracy of the measurement by thermethesiometer 130 or create difficulties in setting up the testing of DUT 10 using probe 132 since test material 12 is larger than probe 132. For example, temperature sensor 118 inside chamber 102 can be configured to measure an external temperature of a DUT on a surface of the DUT that has a length or a width that is smaller than 2.5 centimeters, which is smaller than a diameter of probe 132.

The interior of chamber 102 is heated by heating device 108, which can include, for example, an electric heating element or other type of heating device. Circuitry 106 is configured to control heating device 108 to heat the interior of chamber 102 to an ambient target temperature based on the ambient temperature measured by ambient temperature sensor 110, which can include, for example, a thermistor or other type of temperature sensor. In the example of FIG. 1, the interior ambient temperature measured by ambient temperature sensor 110 is displayed on display 112 exposed on an exterior of chamber 102.

In some implementations, the DUT inside chamber 102 may be operated by a host device outside chamber 102, such as by host device 128 in FIG. 1. Host device 128 can include, for example, a laptop, desktop, tablet, or other computing device, such as an Application-Specific Integrated Circuit (ASIC), Field Programmable Gate Array (FPGA), or Central Processing Unit (CPU). In the example of FIG. 1, host device 128 connects to DUT 10 via an interface 116, such as a USB connector or other type of interface for communication between host device 128 and DUT 10.

Chamber 102 in FIG. 1 includes port 126 or may include another thermally insulated opening for a cable to pass from host device 128 outside chamber 102 to DUT 10 inside chamber 102. In other implementations, host device 128 may interface with DUT 10 wirelessly, or host device 128 may not communicate with DUT 10 inside of chamber 102, such as when operation of DUT 10 inside chamber 102 is not needed or when DUT 10 can operate without communicating with a host device.

Those of ordinary skill in the art will appreciate that other implementations of thermal measurement system 100 can include a different number of components or types of components than shown in FIG. 1. For example, other implementations of thermal measurement system 100 can include multiple temperature sensors 118 for simultaneously testing multiple DUTs whose surface temperatures may be averaged by controller 120 for controlling a surface temperature of test material 12. In yet other implementations, different types of test materials 12 may be simultaneously heated by corresponding heating devices 124. As another example, the location of test material 12 may not be located on an exterior of chamber 102, but may be separate from chamber 102.

Figure 2:
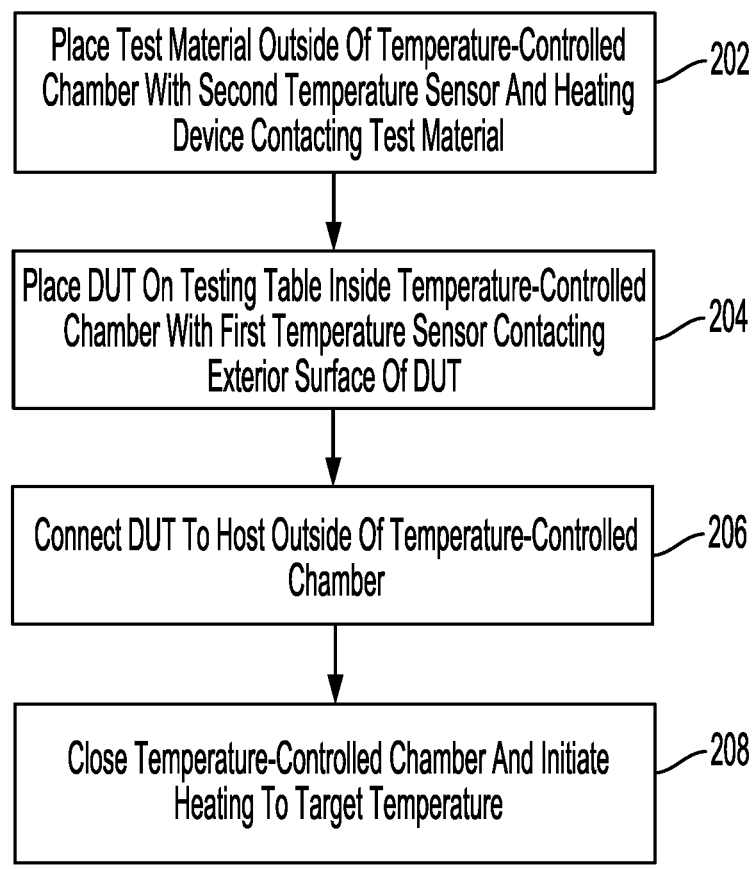
FIG. 2 is a flowchart for a thermal test setup process according to one or more embodiments.

FIG. 2 is a flowchart for a thermal test setup process according to one or more embodiments. The process of FIG. 2 may be performed by, for example, an operator of thermal measurement system 100 or by a robot.

In block 202, test material 12 is placed outside of temperature-controlled chamber 102 with temperature sensor 122 on a surface of test material 12 to measure a surface temperature of test material 12. In addition, test material 12 is placed into contact with heating device 124. In some implementations, this can include placing the test material into a bracket or other designated location for holding test material 12.

In block 204, DUT 10 is placed on testing table 114 inside chamber 102 with temperature sensor 118 contacting an exterior surface of DUT 10. In some implementations, a strap or clip may be used to secure temperature sensor 118 to DUT 10. In yet other implementations, testing table 114 may include one or more built-in temperature sensors 118 that contact an exterior surface of corresponding DUTs when placed on testing table 114.

In block 206, DUT 10 is connected to host device 128 outside of chamber 102. As discussed above with reference to FIG. 1, DUT 10 may be connected wirelessly to host device 128 or may have a wired connection via an interface, such as interface 116. In some implementations, testing table 114 may include a built-in connector or interface for connecting DUT 10.

In block 208, chamber 102 is closed with DUT 10 inside, such as by closing door 104. Heating of the interior of chamber 102 to a target ambient temperature may be initiated via a user interface, such as by display 112, which may include a touchscreen or a button to initiate heating. In some implementations, chamber 102 may be first heated before DUT 10 is placed inside chamber 102.

Those of ordinary skill in the art will appreciate that the order of blocks in FIG. 2 may vary in other implementations. For example, in some implementations, the placement of DUT 10 inside chamber 102 in block 204 may occur before the placement of test material 12 in block 202.

Figure 3:
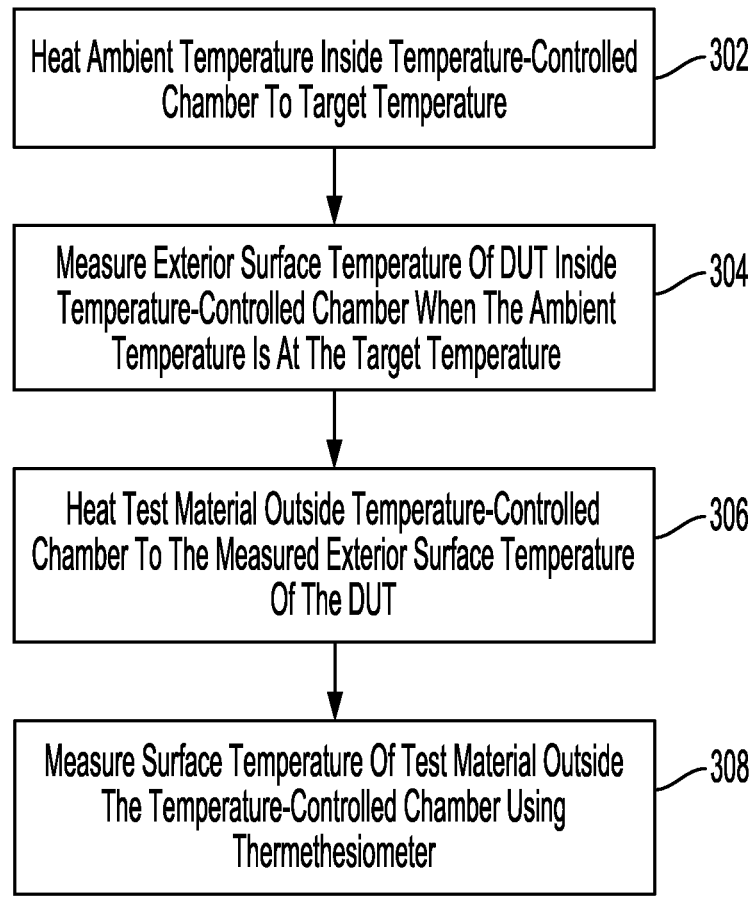
FIG. 3 is a flowchart for a thermal test process for a test material according to one or more embodiments.

FIG. 3 is a flowchart for a thermal test process for a test material according to one or more embodiments. The process of FIG. 3 may be performed following the setup process of FIG. 2 and may be performed by, for example, thermal measurement system 100 in FIG. 1.

In block 302, circuitry 106 controls heating device 108 to heat the ambient temperature inside chamber 102 to a target temperature. As discussed above, the target temperature can be greater than a recommended or design ambient temperature for using a thermethesiometer, such as an ambient temperature greater than 32 degrees Celsius, and that corresponds to an upper operating range specified for DUT 10. Circuitry 106 may use an ambient temperature measured by ambient temperature sensor 110 inside chamber 102 to control heating device 108 to reach the target ambient temperature inside chamber 102.

In block 304, temperature sensor 118 is used to measure an exterior surface temperature of DUT 10 inside chamber 102 when the ambient temperature measured by ambient temperature sensor 110 has reached the target ambient temperature (e.g., 45 degrees Celsius).

The surface temperature measured by temperature sensor 118, or an indication thereof, is provided to controller 120, which controls heating device 124 in block 306 to heat a surface of test material 12 outside of chamber 102 to the surface temperature of DUT 10 measured by temperature sensor 118. Temperature sensor 122 provides a temperature measurement of the surface of test material 12, or an indication thereof, to controller 120, as feedback for increasing, decreasing, or maintaining heat applied to test material 12.

In block 308, the effect of a surface temperature of test material 12 outside of chamber 102 is measured using thermethesiometer 130 via probe 132. In some implementations, probe 132 may remain attached to test material 12 following a setup process, such as the setup process of FIG. 2 discussed above. In other implementations, an operator of thermal measurement system 100 may contact test material 12 with probe 132 when display 112 indicates the ambient temperature inside chamber 102 has reached the target ambient temperature to measure the effect of the surface temperature of test material 12 on skin, and by proxy, the effect of the surface temperature of DUT 10 on skin.

As discussed above, the foregoing thermal measurement systems and methods allow for more accurate testing of the skin effect of surface temperatures of products at ambient temperatures greater than a recommended design temperature for a thermethesiometer (e.g., 32 degrees Celsius). In addition, the foregoing systems and methods facilitate and improve the accuracy of measuring surfaces that are smaller than a probe size of a thermethesiometer.

Other Embodiments

Those of ordinary skill in the art will appreciate that the various illustrative logical blocks, modules, and processes described in connection with the examples disclosed herein may be implemented as electronic hardware, computer software, or combinations of both. Furthermore, the foregoing processes can be embodied on a computer readable medium which causes processor or controller circuitry to perform or execute certain functions.

To clearly illustrate this interchangeability of hardware and software, various illustrative components, blocks, and modules have been described above generally in terms of their functionality. Whether such functionality is implemented as hardware or software depends upon the particular application and design constraints imposed on the overall system. Those of ordinary skill in the art may implement the described functionality in varying ways for each particular application, but such implementation decisions should not be interpreted as causing a departure from the scope of the present disclosure.

The various illustrative logical blocks, units, modules, processor circuitry, and controller circuitry described in connection with the examples disclosed herein may be implemented or performed with a general purpose processor, a Programmable Logic Controller (PLC), a Digital Signal Processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. Processor or controller circuitry may also be implemented as a combination of computing devices, e.g., a combination of a DSP and a microprocessor, a plurality of microprocessors, a System on a Chip (SoC), one or more microprocessors in conjunction with a DSP core, or any other such configuration.

The activities of a method or process described in connection with the examples disclosed herein may be embodied directly in hardware, in a software module executed by processor or controller circuitry, or in a combination of the two. The steps of the method or algorithm may also be performed in an alternate order from those provided in the examples. A software module may reside in RAM memory, flash memory, ROM memory, EPROM memory, EEPROM memory, registers, hard disk, a removable media, an optical media, or any other form of storage medium known in the art. An exemplary storage medium is coupled to processor or controller circuitry such that the processor or controller circuitry can read information from, and write information to, the storage medium. In the alternative, the storage medium may be integral to processor or controller circuitry. The processor or controller circuitry and the storage medium may reside in an ASIC or an SoC.

The foregoing description of the disclosed example embodiments is provided to enable any person of ordinary skill in the art to make or use the embodiments in the present disclosure. Various modifications to these examples will be readily apparent to those of ordinary skill in the art, and the principles disclosed herein may be applied to other examples without departing from the spirit or scope of the present disclosure. The described embodiments are to be considered in all respects only as illustrative and not restrictive. In addition, the use of language in the form of "at least one of A and B" in the following claims should be understood to mean "only A, only B, or both A and B."

What is claimed is:

1. A thermal measurement system, comprising:
    a temperature-controlled chamber configured to house a Device Under Test (DUT);
    a first temperature sensor configured to measure an external temperature of the DUT inside the temperature-controlled chamber;
    a heating device configured to heat a test material outside the temperature-controlled chamber;
    a second temperature sensor configured to measure a temperature of the test material outside the temperature-controlled chamber; and
    a controller configured to control the heating device to heat the test material to the external temperature measured by the first temperature sensor of the DUT inside the temperature-controlled chamber.

2. The thermal measurement system of claim 1, further comprising a thermethesiometer outside the temperature-controlled chamber and configured to indicate a skin effect of a surface temperature of the test material.

3. The thermal measurement system of claim 1, wherein the test material is comprised of the same material as an exterior component of the DUT and has the same thickness as the exterior component of the DUT.

4. The thermal measurement system of claim 1, further comprising means for heating an ambient temperature inside the temperature-controlled chamber to greater than 32 degrees Celsius.

5. The thermal measurement system of claim 1, further comprising means for heating an ambient temperature inside the temperature-controlled chamber to greater than 40 degrees Celsius.

6. The thermal measurement system of claim 1, further comprising means for operating the DUT inside the temperature-controlled chamber.

7. The thermal measurement system of claim 1, wherein the first temperature sensor is further configured to measure the external temperature of the DUT on a surface of the DUT that has a length or a width that is smaller than 2.5 centimeters.

8. A method for measuring a temperature of a test material, the method comprising:
    heating an ambient temperature inside a temperature-controlled chamber to a target temperature, wherein the temperature-controlled chamber houses a Device Under Test (DUT);
    measuring an exterior surface temperature of the DUT inside the temperature-controlled chamber when the ambient temperature is at the target temperature;
    heating a test material outside the temperature-controlled chamber to the measured exterior surface temperature of the DUT; and measuring a surface temperature of the test material outside the temperature-controlled chamber.

9. The method of claim 8, further comprising using a thermethesiometer to indicate a skin effect of a the surface temperature of the test material outside the temperature-controlled chamber.

10. The method of claim 8, wherein the test material is comprised of the same material as an exterior component of the DUT and has the same thickness as the exterior component of the DUT.

11. The method of claim 8, wherein the target temperature is greater than 32 degrees Celsius.

12. The method of claim 8, wherein the target temperature is greater than 40 degrees Celsius.

13. The method of claim 8, further comprising operating the DUT inside the temperature-controlled chamber.

14. A thermal measurement system, comprising:
   a temperature-controlled chamber for housing a Device Under Test (DUT);
   a first temperature sensor configured to measure an external temperature of the DUT inside the temperature-controlled chamber;
   a heating device configured to heat a test material outside the temperature-controlled chamber to the external temperature of the DUT inside the temperature-controlled chamber; and
   a thermethesiometer configured to indicate a skin effect of a surface temperature of the test material outside the temperature-controlled chamber.

15. The thermal measurement system of claim 14, further comprising:
   a second temperature sensor configured to measure the temperature of the test material outside the temperature-controlled chamber; and
   a controller configured to control the heating device to heat the test material to the external temperature of the DUT measured by the first temperature sensor inside the temperature-controlled chamber.

16. The thermal measurement system of claim 14, wherein the test material is comprised of the same material as an exterior component of the DUT and has the same thickness as the exterior component of the DUT.

17. The thermal measurement system of claim 14, further comprising:
   an ambient temperature sensor configured to measure an ambient temperature inside the temperature-controlled chamber;
   a second heating device for heating an interior of the temperature-controlled chamber; and
   circuitry for controlling the second heating device to heat the interior of the temperature-controlled chamber to an ambient target temperature based on the ambient temperature measured by the ambient temperature sensor.

18. The thermal measurement system of claim 17, wherein the target temperature is greater than 40 degrees Celsius.

19. The thermal measurement system of claim 14, further comprising a host configured to perform at least one of supplying power to the DUT inside the temperature-controlled chamber and communicating with the DUT inside the temperature-controlled chamber.

20. The thermal measurement system of claim 14, wherein the first temperature sensor is further configured to measure the external temperature of the DUT on a surface of the DUT that has a length or a width that is smaller than 2.5 centimeters.

* * * * *